United States Patent [19]
Demaray et al.

[11] Patent Number: 6,033,483
[45] Date of Patent: Mar. 7, 2000

[54] ELECTRICALLY INSULATING SEALING STRUCTURE AND ITS METHOD OF USE IN A HIGH VACUUM PHYSICAL VAPOR DEPOSITION APPARATUS

[75] Inventors: Richard Ernest Demaray, Portola Valley; Manuel J. Herrera, San Mateo; David F. Eline, Menlo Park; Chandra Deshpandey, Fremont, all of Calif.

[73] Assignee: Applied Materials, Inc., Santa Clara, Calif.

[21] Appl. No.: 08/899,685

[22] Filed: Jul. 24, 1997

Related U.S. Application Data

[63] Continuation-in-part of application No. 08/268,480, Jun. 30, 1994, abandoned.

[30] Foreign Application Priority Data

Jun. 30, 1995 [JP] Japan .................................. 7-165885

[51] Int. Cl.[7] .................................................. C23C 16/00
[52] U.S. Cl. ...................................... 118/733; 204/298.12
[58] Field of Search ..................... 118/733; 204/298.12, 204/298.19, 298.07

[56] References Cited

U.S. PATENT DOCUMENTS

| | | | |
|---|---|---|---|
| 2,251,510 | 8/1941 | Berghaus et al. | 204/298 |
| 3,945,911 | 3/1976 | McKelvey et al. | 204/298 |
| 4,198,283 | 4/1980 | Class et al. | 204/298.12 |
| 4,204,936 | 5/1980 | Hartsough | 204/192 |
| 4,384,933 | 5/1983 | Takasaki | 204/192.25 |
| 4,392,939 | 7/1983 | Crombeen et al. | 204/298 |
| 4,604,180 | 8/1986 | Hirukawa et al. | 204/298 |
| 4,733,086 | 3/1988 | Simmonds | 250/423 |
| 4,886,412 | 12/1989 | Wooding et al. | 414/416 |
| 4,928,626 | 5/1990 | Carlson et al. | 118/715 |
| 4,976,002 | 12/1990 | Leonov et al. | 15/304 |
| 5,073,716 | 12/1991 | Clemens et al. | 250/492.2 |

(List continued on next page.)

FOREIGN PATENT DOCUMENTS 1193463  8/1989  Japan .................................. F16J 15/10

Primary Examiner—Yogendra Gupta
Assistant Examiner—Christine E. Ingersoll
Attorney, Agent, or Firm—Kenyon & Kenyon; Shirley L. Church

[57] ABSTRACT

In accordance with the present invention, an insulating sealing structure useful in physical vapor deposition apparatus is provided. The insulating sealing structure is capable of functioning under high vacuum and high temperature conditions. The apparatus is a three dimensional structure having a specifically defined range of electrical, chemical, mechanical and thermal properties enabling the structure to function adequately as an insulator which does not break down at voltages ranging between about 1,500 V and about 3,000 V, which provides a seal against a vacuum of at least about $10^{-6}$ Torr, and which can function at a continuous operating temperature of about 300° F. (148.9° C.) or greater. The insulating sealing structure may be fabricated solely from particular polymeric materials or may comprise a center reinforcing member having at least one layer applied to its exterior surface, where the at least one surface layer provides at least a portion of the insulating properties and provides the surface finish necessary to make an adequate seal with a mating surface. A first preferred embodiment comprises an aluminum center reinforcing member having at least one layer of a polymeric insulator applied to provide an insulating, sealing surface. A second preferred embodiment comprises an anodized aluminum center reinforcing member having an inorganic insulator such as silicon oxide, silicon nitride, or aluminum nitride applied to provide the insulating, sealing surface. A third preferred embodiment comprises a graphite, silica or glass fiber-reinforced member having at least one layer of a polymeric insulator applied thereover, to provide an insulating sealing surface. A fourth preferred embodiment comprises a silicon nitride or graphic fiber-reinforced member having an inorganic, non-metallic insulating sealing surface thereover.

10 Claims, 8 Drawing Sheets

U.S. PATENT DOCUMENTS

| | | | |
|---|---|---|---|
| 5,169,509 | 12/1992 | Latz et al. | 204/298.03 |
| 5,178,739 | 1/1993 | Barnes et al. | 204/192.12 |
| 5,203,980 | 4/1993 | Cremer et al. | 204/298.12 |
| 5,286,361 | 2/1994 | Makowiecki et al. | 204/298.12 |
| 5,297,365 | 3/1994 | Nishioka et al. | 451/41 |
| 5,316,711 | 5/1994 | Throne | 264/68 |
| 5,401,812 | 3/1995 | Yamamoto et al. | 525/426 |

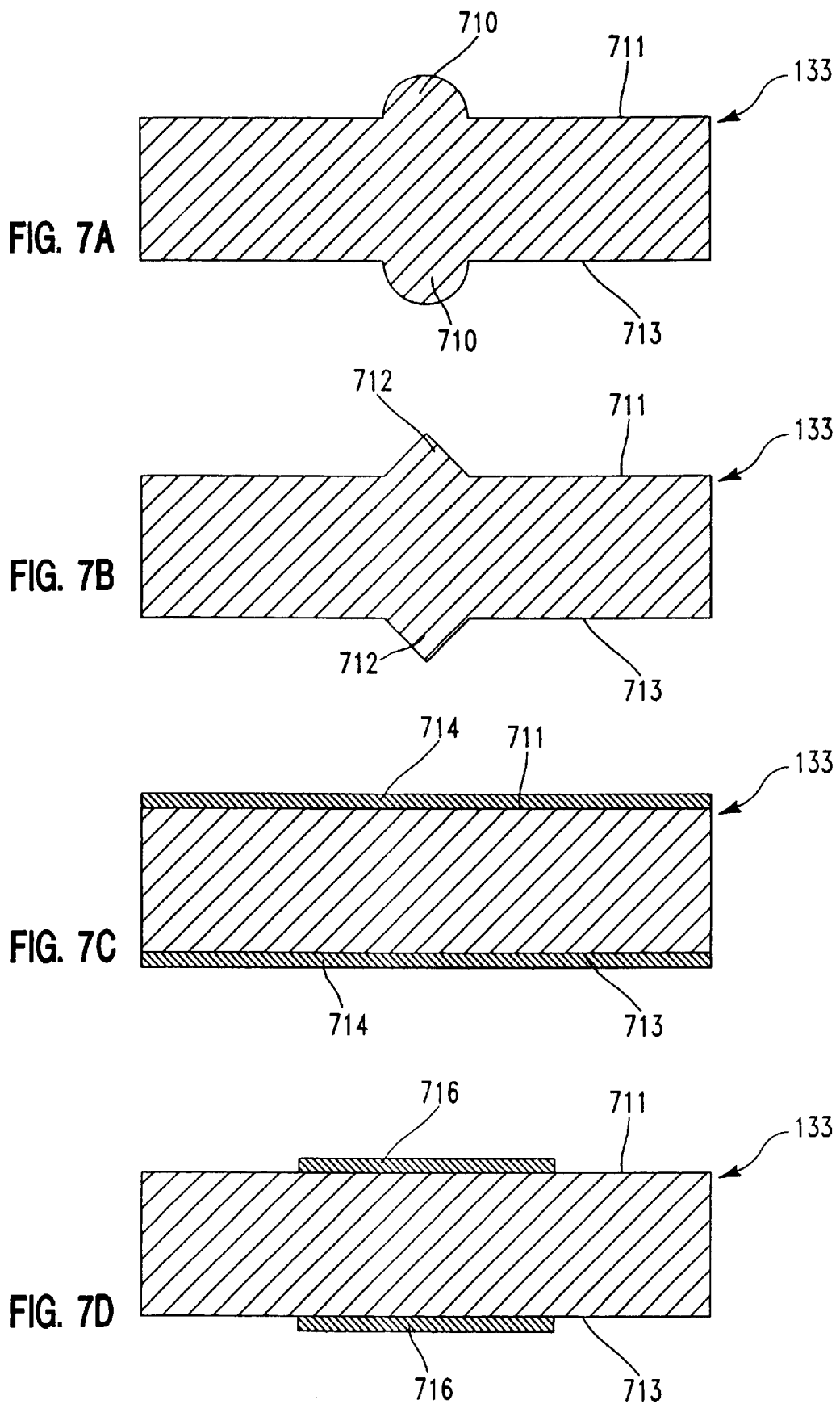

ELECTRICALLY INSULATING SEALING STRUCTURE AND ITS METHOD OF USE IN A HIGH VACUUM PHYSICAL VAPOR DEPOSITION APPARATUS

CROSS-REFERENCE TO RELATED PATENT APPLICATION

This patent application is a continuation-in-part of U.S. patent application Ser. No. 08/268,480, filed Jun. 30, 1994 now abandoned.

BACKGROUND OF THE INVENTION

1. Field of the Invention

The present invention pertains to an electrically insulating sealing structure which can be used in semiconductor processing such as physical vapor deposition (sputtering). The electrically insulating sealing structure is particularly useful in processing apparatus requiring operation at a vacuum of at least $10^{-6}$ Torr and continuous use at temperatures ranging from about $-10°$ F. ($-23.2°$ C.) to about $750°$ F. ($400°$ C.).

2. Description of the Background Art

Sputtering describes a number of physical techniques (such as DC plasma enhanced sputtering, RF plasma, and ion gun) commonly used in the semiconductor industry for the deposition of thin films of various metals such as aluminum, aluminum alloys, refractory metal silicides, gold, copper, titanium-tungsten, tungsten, molybdenum, tantalum and, less commonly, silicon dioxide and silicon onto an item (a substrate). In general, the techniques involve producing a gas plasma of ionized inert gas "particles" (atoms or molecules) by using an electrical field in an evacuated chamber. The ionized particles are then directed toward a "target" and collide with it. As a result of the collisions, free atoms or groups of ionized atoms of the target material are ejected from the surface of the target, essentially converting the target material to the free atoms or molecules. The free atoms escaping the target surface are directed toward the substrate and form (deposit) a thin film on the surface of the substrate.

A typical plasma sputtering process uses a magnetic field to concentrate the plasma ions performing the sputtering action in the region of the magnetic field so that target sputtering occurs at a higher rate and at a lower process pressure. In DC sputtering, the target itself is electrically biased with respect to the substrate on which the sputtered material is to be deposited and with respect to the sputter processing chamber. The sputtering target functions as a cathode, with the substrate (depending on the composition of the substrate), the platform on which the substrate sits, and/or the process chamber functioning as an anode. A high voltage, typically between about 200 and 800 volts, is applied between these two electrodes, with the substrate disposed upon a platform positioned opposite the cathode. The pressure in the sputter processing chamber is typically reduced to about $10^{-6}$ to $10^{-9}$ Torr, after which argon, for example, is introduced to produce an argon partial pressure ranging between about $10^{-2}$ to about $10^{-4}$ Torr. Considerable energy is used in generating the gas plasma and creating ion streams impacting on the cathode, and it is not unusual for the temperature of the internal walls, in particular the dark space shield inside the sputter processing chamber, to rise above $750°$ F. ($400°$ C.).

Recent developments in liquid crystal flat panel display technology have resulted in an interest in processing apparatus capable of carrying out sputtering on a particularly large scale. For example, rectangular flat panels approximately 15 in. by 19 in. (0.38 m×0.48 m) are not uncommon, with the industry moving toward 48 in. by 48 in. (1.2 m×1.2 m) panels. To achieve acceptable display performance over such a large surface area, it is necessary that the conductivity of the metallized electrodes in the underlying semiconductor device, which controls operation of the liquid crystal composition, be especially high. To achieve this high conductivity, technologists would like to use aluminum for the metallized electrodes; however, aluminum oxides form very rapidly in the presence of oxygen, contaminating the deposited aluminum layer and reducing its conductivity. To be able to sputter deposit a low stress film of pure layer of aluminum having the desired conductivity, it is necessary to carry out the sputtering operation at a particularly high vacuum. This reduces the partial pressure of residual ambient air components such as oxygen and water vapor which lead to oxidation of the depositing aluminum. For example, in a sputtering process chamber evacuated to $10^{-6}$ Torr, residual oxygen in the sputtering chamber will deposit a monolayer of oxygen upon an aluminum substrate surface within approximately one second; however, at $10^{-9}$ Torr, it takes about 1,000 seconds to deposit a monolayer of oxygen upon the substrate. This makes it desirable to deposit the conductive aluminum layer in process chambers for which the base pressure is less than $10^{-6}$ Torr, and preferably at $10^{-8}$ to $10^{-9}$ Torr, to obtain a satisfactory conductivity of a low-stress deposited aluminum layer.

FIG. 1 shows an exploded view of a sputtering process apparatus 100 of the kind used to produce flat panel display semiconductor devices. The sputtering process chamber 138 is accessed through a slit-valve opening 145 such that a substrate to be deposited upon (not shown) is delivered to a sputtering pedestal 146. The insulating structure used to insulate target assembly 124 (the cathode) from process chamber 138 (the anode) includes an outer insulator 134 and a main insulator 133. Target assembly 124 is further insulated from chamber cap 113 using upper insulator 117. Power is applied via power connection 155 which progresses through the apparatus through power connection hole 92. Vacuum passage 156 provides evacuation capability for the chamber cap 113, and a cooling manifold (not shown) included as a part of target assembly 124, provides cooling for the sputtering target. A more detailed description of this sputtering process chamber and its functioning is available in copending patent application Ser. No. 08/236,715 of Richard E. Demaray et al., filed Apr. 29, 1994, and commonly owned by the assignee of this application, which copending patent application is hereby incorporated by reference in its entirety.

Typically upper insulator 117 and outer insulator 134 are constructed from a plastic material such as, for example, acrylic or polycarbonate, as these insulators are not exposed to the high temperatures experienced by main insulator 133 and are subjected to less severe vacuum sealing requirements than main insulator 133. In the past, the main insulator 133 has been constructed from a ceramic material, for example 99.7% pure aluminum oxide (alumina) or quartz, to provide the dielectric properties required at operating conditions. Typical operating conditions expose the ceramic material to voltages as high as 1,000 volts, at temperatures which may be as high as about $750°$ F. ($400°$ C.) and which are frequently as high as about $400°$ F. ($204.4°$ C.). Further, main insulator 133 must also be able to sustain high compressive loads (several tons) and to make a vacuum seal with a process chamber base pressure preferably in the range of $10^{-8}$ to $10^{-9}$ Torr. Thus, the material of construction of the main insulator must meet stringent requirements.

FIG. 2A shows a cross sectional view of an assembled sputtering process chamber of the kind shown in FIG. 1. Particular detail definition in the area of main insulator 133 is shown in FIG. 2B. The target assembly 124 has a target backing plate 128 and O-ring groove 129 which is fitted with an elastomeric O-ring (not shown), typically Viton® (fluorocarbon, trademark of Du Pont Co., Wilmington, Del.), which seals against both target backing plate 128 and ceramic main insulator 133. Ceramic main insulator 133 is further sealed against sputtering chamber 138 via an O-ring groove 139 in the top flange of sputtering chamber 138, which also contains an elastomeric O-ring (not shown) constructed from a material such as Viton®. FIG. 2B shows the directional indicator P, indicating the direction perpendicular to seal which will be referred to subsequently herein.

Main insulator 133 is particularly difficult to fabricate and to handle due to the mechanical properties of the alumina from which it is fabricated. Main insulators which are 48 in. by 48 in. (1.2 m×1.2 m) in exterior dimension, having a width of approximately 1 in. (0.0254 m) and a thickness of about 0.5 in. (0.0127 m) are particularly difficult and costly to fabricate, and are difficult to handle without damage during sputter processing operations. Further, due to the notch sensitivity of crystalline ceramic materials, it is not practical to machine a groove into the surface of main insulator 133. Thus, the groove 129 used to provide support for the O-ring means of sealing between sputter target assembly 124 and main insulator 133 must be machined into the surface of target assembly 124. Since target assembly 124 is consumed during operation of the sputtering apparatus, the groove must be machined into each new, consumable sputtering target, adding to the cost of the target.

It would be highly desirable to have a main insulator having the necessary dielectric properties and having adequate mechanical properties to function in the application while providing ease in fabrication and handling.

SUMMARY OF THE INVENTION

In accordance with the present invention, an apparatus useful in semiconductor processing is provided; the apparatus functions as an electrical insulator and provides a sealing surface for use in semiconductor processing operations carried out under high vacuum and high temperature. In particular, the apparatus is a three dimensional structure fabricated using material having a specifically defined range of electrical, chemical, mechanical and thermal properties. The three dimensional structure may be formed from a single material or from a composite of materials. Preferably the three dimensional structure has a rigid or rigidized center portion or member and an exterior surface which can be deposited, cured or polished to have a surface roughness height value of about 16 µin. (0.40 µm) or less in the direction perpendicular to seal. Typically the rigid member will be formed from a different material that used to provide the exterior surface. The structure may be of single piece construction, molded, machined, or cast directly to the desired dimensions, may be a rigid center member with an inorganic or an organic coating (or a combination thereof) applied to its exterior surface, or may be an assembly of multiple pieces joined together using various techniques.

The apparatus comprising the insulating structure should not decompose under vacuum, and any outgassing of water or absorbed gases must be sufficiently small to sustain a base pressure of at least $10^{-6}$ Torr, and preferably $10^{-8}$ to $10^{-9}$ Torr. The sealing surface of the insulating sealing structure should be capable of being polished to a roughness height value of about 16 µin (0.40 µm) or less in the direction perpendicular to seal. The insulating, sealing structure should also exhibit a dielectric strength in air of at least 50 KV/in (1.96 MV/m) and a deflection temperature @ 264 PSI (1.82 MPa) of at least 300° F. (148.9° C.).

When the insulating sealing structure is constructed from pieces which are joined together, this joining may be by mechanical fastening means, by physical means such as diffusion bonding or solvent bonding, by chemical means such as covalent or ionic bonding using an adhesive, or by other appropriate method. However, a one piece structure is preferable, due to the high vacuum conditions under which the sealing performance must occur.

One preferred embodiment of the insulating sealing structure comprises a groove machined on at least one surface of the structure which enables the structure to be used in combination with an elastomeric O-ring, to achieve an adequate seal at minimal contact pressures between the insulating sealing structure and any other surface with which a seal is to be formed.

A second preferred embodiment of the insulating sealing structure comprises a continuous contacting bead or molding which has been machined upon or formed on at least one surface of the structure. The continuous contacting bead or molding eliminates the need for an O-ring to provide a seal with a mating surface. This continuous bead or molding can be in the shape of a triangle, rising to a relatively narrow upper surface which forms the line of continuous contact which makes the seal. The continuous bead or molding can be in a more rounded, mound shape, or another appropriate design which optimizes the ability of the continuous bead to provide an adequate seal with a mating surface.

A third preferred embodiment of the insulating sealing structure comprises the insulating sealing structure having on at least one of its surfaces a continuous coating of an insulating and/or elastomeric material which assists the insulating sealing structure in making an adequate seal with a mating surface.

In a fourth preferred embodiment, the insulating sealing structure comprises a center reinforcing member having at least one layer applied to its exterior surface, where the at least one surface layer provides at least a portion of the insulating properties of the insulating sealing structure and provides the surface finish necessary to make an adequate seal with a mating surface.

BRIEF DESCRIPTION OF THE DRAWINGS

FIG. 7A shows a cross sectional view of a sealing bead machined upon the sealing surfaces of a main insulator of the present invention.

FIG. 7B shows a cross sectional view of an alternative sealing bead machined upon the sealing surfaces of a main insulator of the present invention.

FIG. 7C shows a cross sectional view of a layer of sealing material, preferably a dielectric and/or elastomeric material, deposited upon the sealing surfaces of a main insulator of the present invention.

FIG. 7D shows a cross sectional view of an enclosing sealing material, preferably a dielectric and/or elastomeric material, deposited upon the major surfaces of a main insulator of the present invention.

DETAILED DESCRIPTION OF THE PREFERRED EMBODIMENTS

Figure 1:
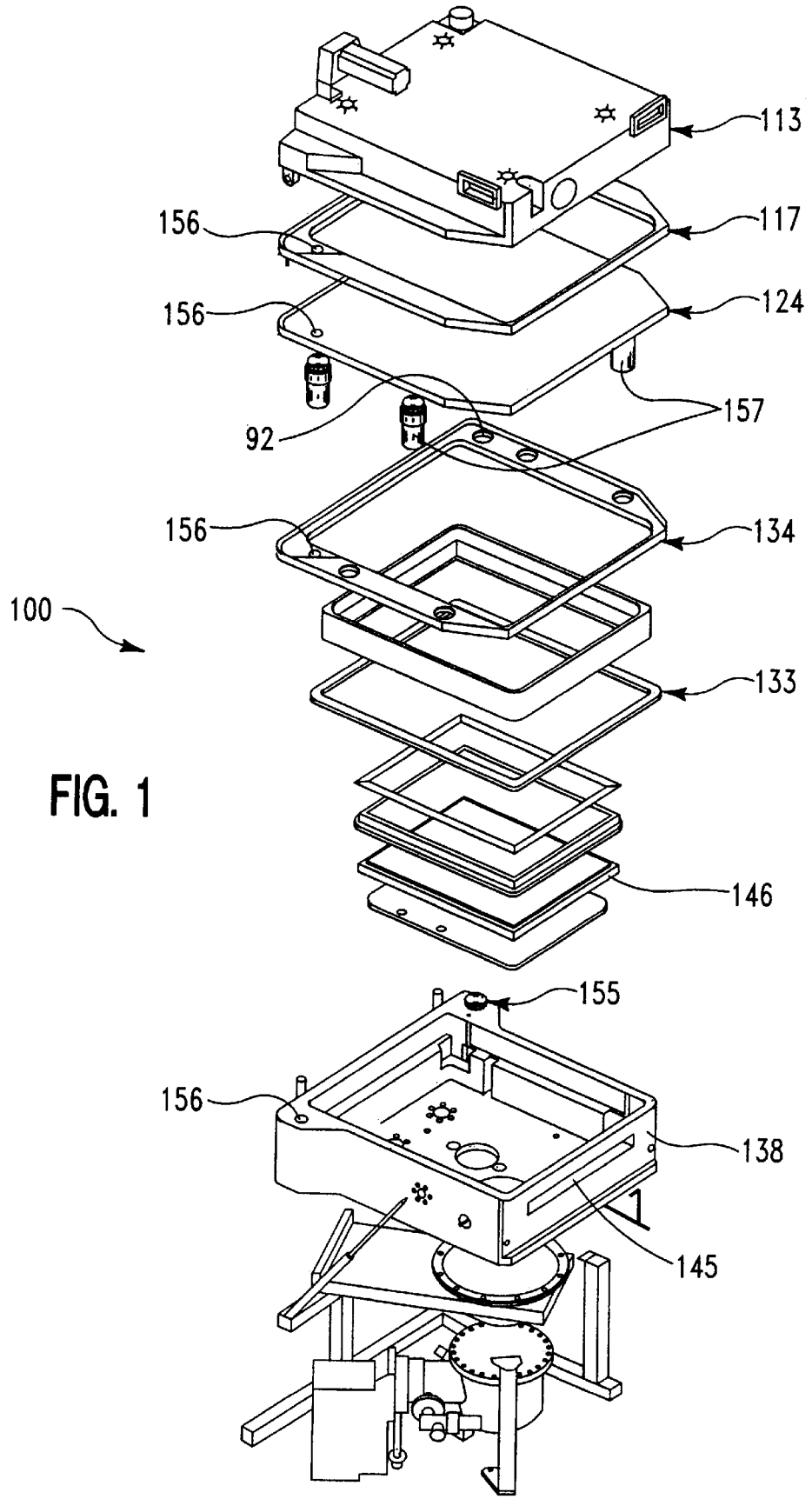
FIG. 1 shows an exploded view of a sputtering process chamber of the kind used to produce flat panel display semiconductor devices.

The present invention relates to an electrically insulating structural component of a semiconductor processing apparatus. The structural component is three dimensional, and is typically used as the main insulator in a sputtering process apparatus, insulating the cathode portion of the apparatus from the anode portion of the apparatus.

The insulating structure (insulating apparatus) is typically used in high vacuum systems where the base pressure vacuum exceeds $10^{-6}$ Torr. Due to the degree of vacuum involved, sealing of the sputtering process apparatus from ambient atmosphere is a significant problem. The insulating structure must perform adequately as a sealing structure as well as an insulating structure when used in the manner illustrated in FIG. 1.

The important electrical, chemical, mechanical, thermal and surface properties which should be provided by the combination of the materials of construction and the structure into which they have been fabricated are as follows:

1) The apparatus comprising the insulating sealing structure should not decompose under vacuum and any outgassing of water, other volatiles, and absorbed gases must be sufficiently small to sustain a base pressure of at least $10^{-6}$ Torr, and preferably $10^{-8}$ to $10^{-9}$ Torr. This means at least the exterior surface material of the insulating sealing structure should not decompose under vacuum and all materials which make up the structure should not contain elements or compounds which will outgas in amounts which cause problems under operational conditions to which the insulating sealing structure will be exposed. For example, the materials must not contain water or oxygen, for example, in excessive amounts as originally fabricated, and must resist the absorption of water during storage and use, for example. In the present instance, water absorption for a polymeric material, determined using ASTM D-570 should not exceed about 0.25% in 24 hrs @ 73° F. (22.8° C.). ASTM D-570 is one of many testing standards promulgated by the American Society for Testing and Materials of Philadelphia, Pa.

2) The sealing surface of the insulating sealing structure should be capable of being polished to a roughness height value of about 16 $\mu$in (0.40 $\mu$m), preferably 8 $\mu$in (0.20 $\mu$m) in the direction perpendicular to the seal. The ability of a polymeric material or an inorganic material to be polished to a roughness height value in the range of 0.40 $\mu$m or lower is of particular importance, as it affects the ability to obtain a seal adequate to enable establishment of a vacuum of at least $10^{-6}$ Torr.

3) The insulating sealing structure should show adequate maintenance of dielectric properties and of dimensional and mechanical stability, to continue to function adequately at continuous exposure to at least about $10^{-6}$ Torr and at a continuous operating temperature of about 300° F. (148.9° C.) or greater, for a time period adequate to meet production needs, preferably for at least several weeks. The dielectric properties and dimensional and mechanical properties known to provide an adequate insulating sealing structure are those listed below, as an insulating sealing structure having such properties has performed satisfactorily under continuous operating conditions of about $10^{-6}$ Torr and at 300° F. (148.9° C.) or greater.

a) Dielectric strength in air (of a 1/16 in. (1.7 mm) thick sample) of at least 50 KV/in. (1.96 MV/m), as measured using ASTM D-149; or volume resistivity at 73° F. (22.8° C.) of at least $10^{10}$ Ω-m, as measured using ASTM D-257.

b) a linear coefficient of expansion of less than about $50\times10^{-6}$ in/in/°F. ($90\times10^{-6}$ mm/mm/°C.), as measured using ASTM E-228.

c) a deflection temperature @ 264 PSI (1.82 MPa) of at least 300° F. (148.9° C.).

d) an ultimate compressive strength greater than about 15,000 PSI (103.4 MPa), as measured using ASTM D-695.

When the insulating sealing structure is constructed from pieces which are joined together, this joining may be by mechanical fastening means, by physical means such as diffusion bonding or solvent bonding, by chemical means such as covalent or ionic bonding using an adhesive, or by other appropriate method. However, a one piece structure is preferable, due to the high vacuum conditions under which the sealing performance must occur.

FIG. 1 shows an exploded view of a sputtering process apparatus 100, of the kind used to produce flat panel display semiconductor devices. The sputtering process apparatus 100 includes a main insulator 133 which provides electrical insulation between target assembly 124 (which acts as a cathode) and sputtering process chamber 138 (which acts as an anode). The voltage across main insulator 133 typically ranges from about 200 to about 800 volts. The amount of vacuum present at the location of main insulator 133 is minimally $10^{-6}$ Torr, and preferably ranges between about $10^{-8}$ and $10^{-9}$ Torr. In addition, the continuous operational temperature present at the location of main insulator 133 is minimally about 100° F. (37.8° C.) and may rise as high as about 550° F. (287.8° C.). The compressive pressure exerted on the surface of main insulator 133 is typically about 75 lb./lineal inch, (13.1 N/lineal mm), but can rise to at least 2 to 3 times that amount, depending on the size of the sputtering process apparatus and process conditions utilized.

Main insulator 133 has been constructed from alumina and quartz in the past. The preferred alumina is 99.5% minimum purity and has a density of about 2.2 to 2.4 g./cc. This material of construction provides an outgas rate of less than about $2.0 \times 10^{-7}$ Torr—liter/sec/cm² under sputtering process conditions. The water absorption of fired alumina of the kind used to fabricate insulators has been observed to be particularly low upon exposure to ambient atmosphere, so this is not a factor. The surface of the main insulator structure constructed from alumina can be polished to a roughness height value of 8 μin (0.20 μm) in the direction perpendicular to seal. The dielectric strength for the alumina material in air is about 250 kV/in. (9.8 MV/m). The volume resistivity of the alumina material is at typically $10^{12}$ to $10^{14}$ Ω-cm. The linear coefficient of expansion for the alumina material is $9 \times 10^{-6}$ in./in./°F. (16.2 mm/mm/°C.). The ultimate compressive strength for the alumina material can range from about 15,000 to about 60,000 PSI (103–414 MPa). One skilled in the art can see that the alumina material can meet the electrical and vacuum performance criteria previously specified for an electrical insulating material to be used for main insulator 133.

However, as the technology in flat panel display has developed so successfully, as previously described, there has been an increasing desire to produce larger display panels, leading to the desire for larger dimensional sputtering capability. As dimensions of sputtering chamber 138 (FIG. 1) have increased, the perimeter dimensions of main insulator 133 have increased in proportion. As a result, it is presently desired to have a rectangular-shaped main insulator 133 about one inch (0.0254 m) in width and about one half inch (0.0127 m) in thickness and having a length of about 48 inches (1.2 m) on each of its four sides. Construction of a main insulator of these dimensions would require use of a sheet of "green" alumina approximately 48 inches (1.2 m) square and one half inch (13 mm) thick, which would enable machining of a continuous (jointless) structure. Alternatively, the structure would have to be cast directly to dimension by the alumina manufacturer. The jointless structure is required due to the inability to join pieces of alumina together in a manner which will not leak across the joint upon application of a vacuum of at least $10^{-6}$ Torr across the joint while maintaining electrical insulation. Either of these methods of construction of an alumina main insulator 133 are extremely expensive. In fact, the cost of a main insulator fabricated to these dimensions would be about 2.5 to 3 times higher than the same insulator fabricated from the polymeric materials of the present invention.

In addition, the alumina is a very brittle, crystalline material, increasing the possibility of damage to main insulator 133 upon handling during sputtering process operations. For example, the Tensile Strength for alumina ranges from about 700 to about 3,000 PSI (4.8–20.7 MPa) and Impact Strength (unnotched) ranges from about 0.17 to about 0.25 ft-lb (0.34 J); ½ in. (13 mm) rod. This compares with Tensile Strength for the polymeric materials of the present invention ranging from about 5,000 to about 15,200 PSI (34–105 MPa), and an unnotched Izod Impact Strength ranging from about 25 to about 30 ft-lb/in. (1,300–1,600 J/m).

It is highly desirable to use an insulating material which has the necessary dielectric properties and adequate mechanical properties to function in the application, while providing ease in fabrication and handling. For this reason, outer insulator 134 and upper insulator 117 of sputtering process apparatus 100 illustrated in FIG. 1 are typically constructed from a plastic material such as, for example, acrylic or polycarbonate. However, these materials cannot be used for fabrication of main insulator because of creep and poor compressive strength at elevated temperature and poor high vacuum performance.

High temperature, high performance engineering plastics such as Vespel® polyimide (available from DuPont); Arlon polyetheretherketone (available from Greene, Tweed & Co.); and, Ultem® polyetherimide (available from General Electric) have been used in high temperature semiconductor applications for construction of a number of small structures such as bearing surface coatings, bushings, washers and spacers. However, these materials have not been used to construct a part like the main insulator of the present invention, because of the large size sheet required, and possibly because of the numerous foreseeable problems in such an application.

The more significant barriers to use of these kinds of materials in fabrication of main insulator 133 relate to outgassing characteristics of the materials under process operational conditions, and to the ability to seal against the $10^{-8}$ to $10^{-9}$ Torr operational vacuum, particularly at continuous operational temperatures in the range of 400° F. (204.4° C.) to 550° F. (287.8° C.).

The Table, below, shows particularly important physical and mechanical properties for Ultem® 1000 polyetherimide, Vespel® SP-1 polyimide, Arlon® 1000 polyetheretherketone. These high temperature, high performance engineering plastics, and others demonstrating equivalent performance properties to those shown in the Table, can be used as the sole material of construction for the insulating sealing apparatus of the present invention or as a surface layer applied over an interior rigidizing structure.

Other additional high performance engineering plastics useful in fabrication of the insulating sealing apparatus include: G-3 grade fiberglass-reinforced phenolic which meets the military specification Mil-I-24768/18-GPG; G-10 and G-11 grade fiberglass-reinforced epoxies which meet the military specifications Mil-I-24768/2/27-GEE, GEE-F and Mil-I-24768/3-GEE, respectively. These materials have previously been used as an ablative material in aerospace applications. These engineering plastics or an equivalent epoxy or phenolic-based material, the surface of which has been polished to a surface roughness of about 16 μin (40 μm) or less can be used.

TABLE

| Material | Dielectric Strength kV/in. ASTM D-149 | Volume Resistivity Ω-cm ASTM D-257 | Linear Coefficient of Expansion in./in./° F. ASTM D-696 | Water Absorption % ASTM D-570 | Tensile Elongation % ASTM D-1708 | Notched Izod Impact Strength ft-lbs./in. ASTM D-256 | Deflection Temperature ° F. @ 264 PSI ASTM D-648 | Ultimate Compressive Strength ASTM D-695 |
|---|---|---|---|---|---|---|---|---|
| ULTEM ® 1000 | 830 | $6.7 \times 10^{17}$ | $31 \times 10^{-6}$ | 0.25 | 60 | 1.0 | 392 | 21,900 |
| VESPEL ® SP-1 | 560 | $10^{16}$–$10^{17}$ | $30 \times 10^{-6}$ | 0.24 | 7.5–8.0 | 1.5 | 680 | 19,300 |
| ARLON ® 1000 | 480 | $4$–$9 \times 10^{16}$ | $26 \times 10^{-6} \leq 302°$ F. $60 \times 10^{-6} \geq 302°$ F. | 0.14 | 35 | 1.6 | 360 | 17,110 |

EXAMPLE

Figure 3A:
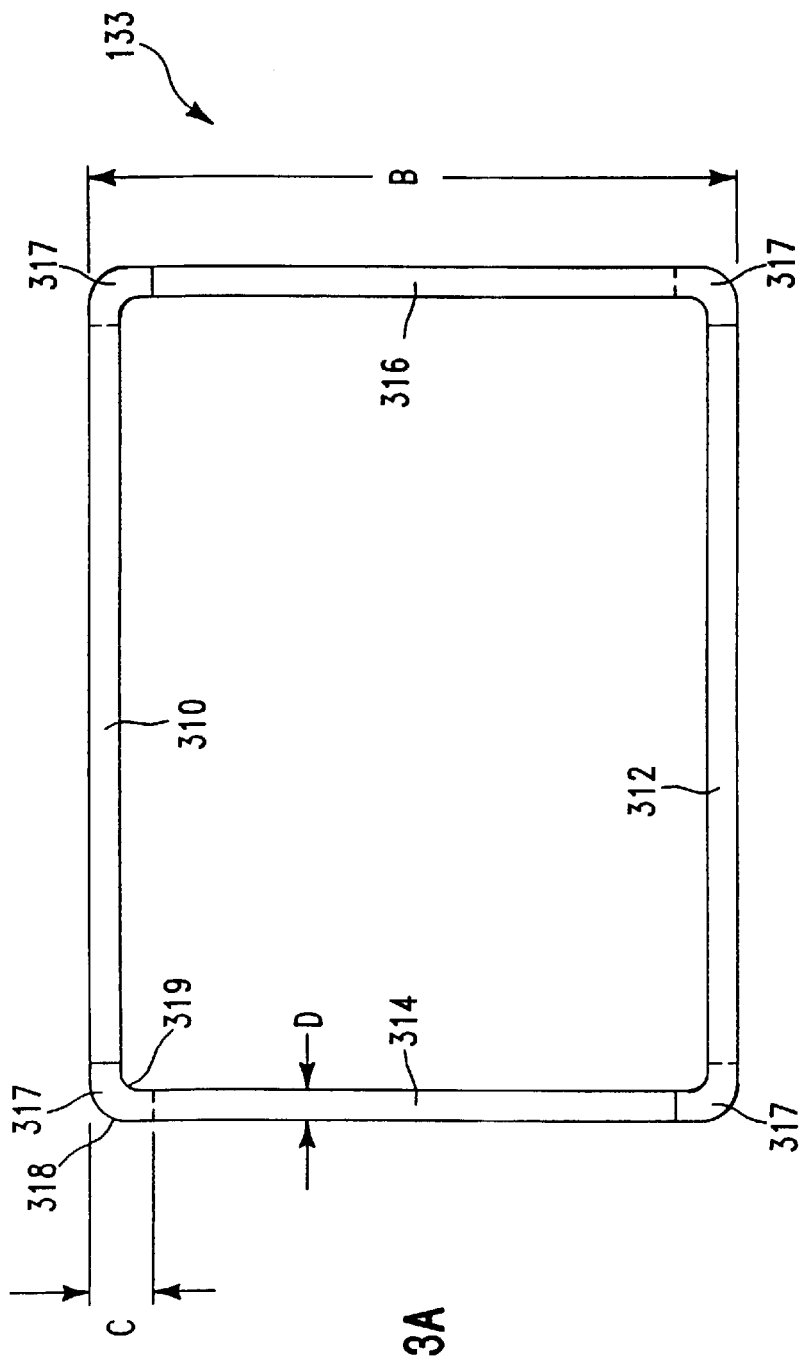
FIG. 3A illustrates a top view of a rectangular-shaped main insulator of the kind typically used in sputtering apparatus for flat panel displays. In particular, the rectangular shaped structure is formed from four pieces of sheet stock which are joined together using a flush lap joint at each of the four corners of the rectangle.

A rectangular main insulator was fabricated using ULTEM® 1000 to the dimensions described below, with reference to FIGS. 3A and 3B, which show the top view of the main insulator and a side view of one member, respectively. Two members, 310 and 312 of rectangular main insulator 133 were fabricated to a dimension A of 26.7 inches (0.678 m) in length. The remaining two members 314 and 316 were fabricated to a dimension B of 23.2 inches (0.589 m) in length. The four members 310, 312, 314, and 316 were fastened together using a flush lap joint 317 at each end of each member. The flush lap joints 317 are illustrated in FIG. 3A. Lap joint 317 has a dimension C of 1.5 inches (38 mm) and is symmetrical so that this dimension applies to the length of the joint in the principal direction of each member it joins. The external radius 318 of lap joint 317 is approximately 0.75 inches (19 mm), while the internal radius 319 is about 0.50 inches (13 mm). The flush lap joints were prepared using standard solvent bonding techniques. Methylene chloride was used to swell (partially solvate) each surface to be bonded, such as surface 320 of member 310, illustrated in FIG. 3B. The surfaces to be bonded were then pressed together at a pressure of at least 20 PSI (0.138 MPa), exposed to ambient atmosphere, permitting the methylene chloride to evaporate. The width D of main insulator members 310, 312, 314, and 316 was 1.0 inches (25.4 mm), and the thickness E was 0.5 inches (13 mm).

Figure 2A:
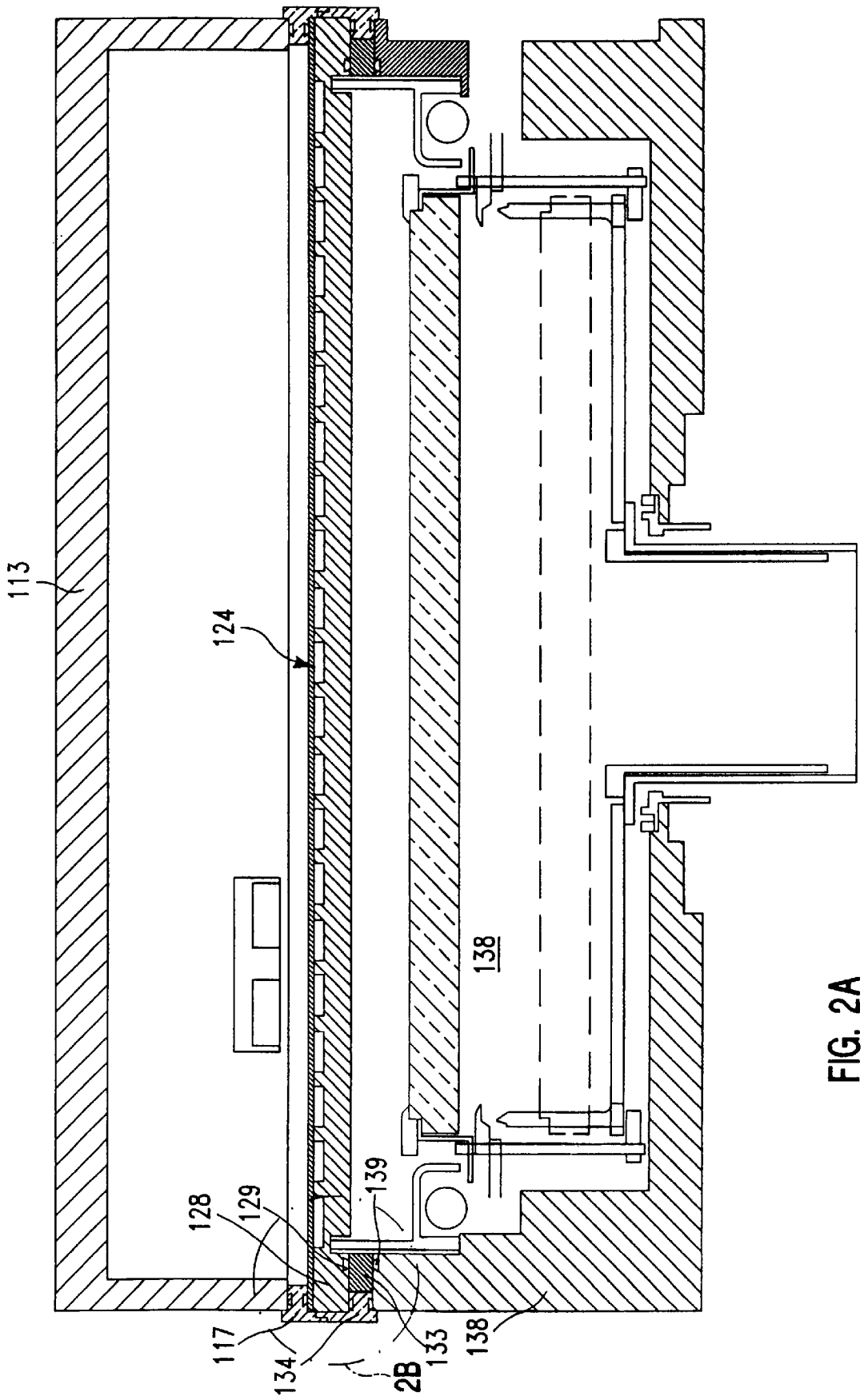
FIG. 2A shows a cross-sectional view of an assembled sputtering process chamber of the kind shown in FIG. 1, with particular definition in the area of the main insulator, upper insulator, and lower insulator.
Figure 2B:
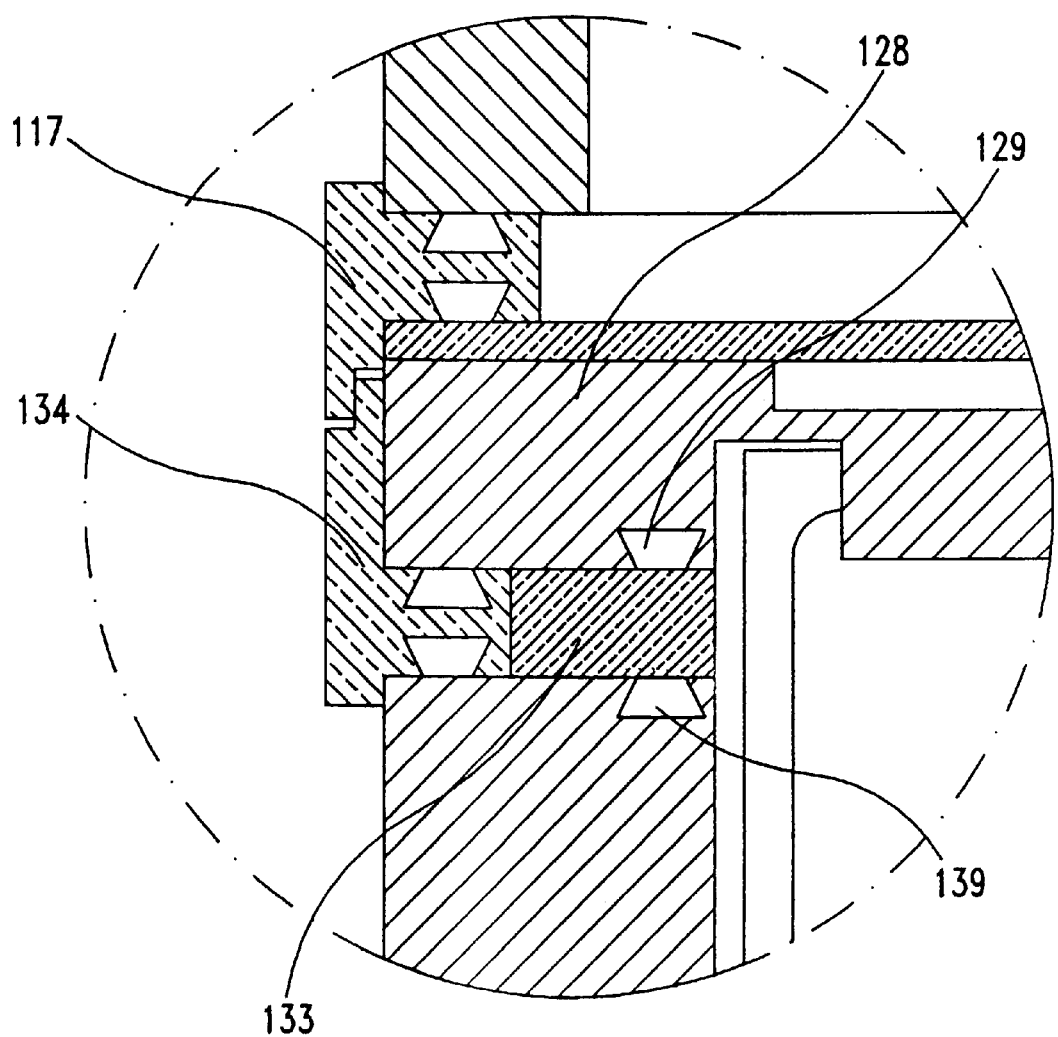
FIG. 2B shows a cross sectional detail view of the area of the main insulator, upper insulator, and lower insulator defined in FIG. 2A.
Figure 3B:
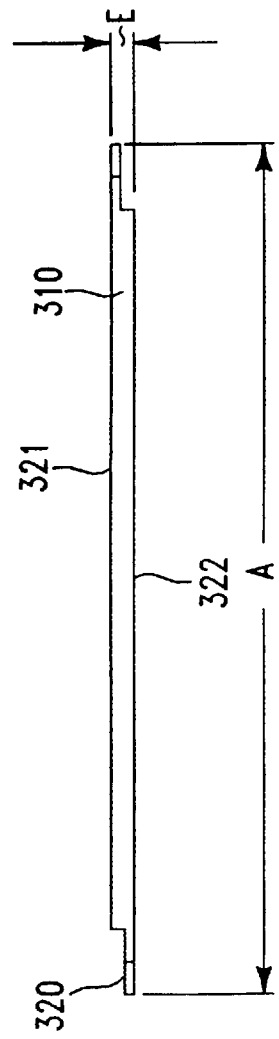
FIG. 3B shows the side view of one of the four members used to fabricate the rectangular-shaped main insulator of FIG. 3A.

Upon completion of assembly of the four members of main insulator 133, the upper and lower surfaces, shown in FIG. 3B as 321 and 322, respectively, were polished to a finish of 8 μin. (0.20 μm) in the direction perpendicular to seal. The 8 μin. (0.20 μm) finish provided a sealing surface for mating with the O-rings (not shown, but located in O-ring grooves 129 and 139) used to create a seal between target assembly backing plate 128 and main insulator 133, and between the top flange of sputtering chamber 138 and main insulator 133, as illustrated in FIG. 2.

The main insulator 133, fabricated from ULTEM® 1000, was then evaluated in a sputtering apparatus of the kind shown in FIG. 1. The operational voltage applied to main insulator 133 was about 1.0 kV/in. (0.039 MV/m); the vacuum across sealing surfaces of the insulator was 6.7× $10^{-7}$ Torr; the maximum temperature of the insulator during evaluation was approximately 300° F. (148.9° C.). Pressure leaks were detected at some of the flush lap joints.

Figure 4A:
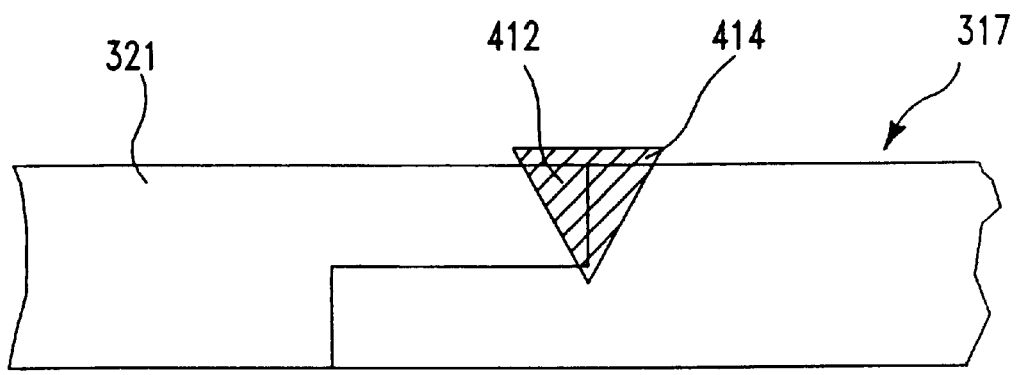
FIG. 4A shows a side view of a flush lap joint of the main insulator illustrated in FIG. 3A. In particular, the flush lap joint has been modified using a triangular-shaped insert to stop leakage which occurred at the lap joint upon exposure to sputtering operational conditions.
Figure 4B:
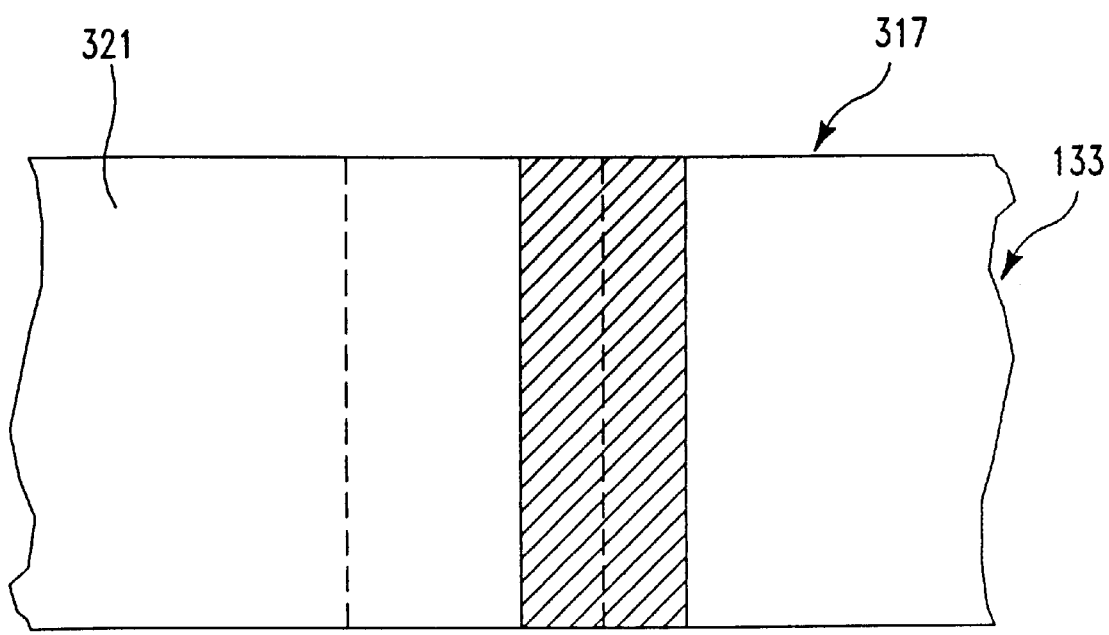
FIG. 4B shows a top view of the modified lap joint of FIG. 4A. Excess insert material is removed to provide a flush top surface.

Leaks at the flush lap joints were repaired by modifying the lap joints to include a wedge of ULTEM® 1000 overlaying a portion of the joint nearest the sealing surface, as illustrated in FIGS. 4A and 4B. FIG. 4A shows a side view of flush lap joint 317 having a wedge 412 of ULTEM 1000® solvent-bonded/pressed into place. Wedge 412 overage 414 is subsequently machined to provide a flush surface 321 as shown in the FIG. 4B top view. The solvent bonding of wedge 412 was carried out in the same manner as previously described for solvent bonding of the flush lap joints. The flush upper surface 321 of each modified joint 317 was repolished to the 8 μin.(0.20 μm) finish.

Upon reexposure of main insulator 133 to the evaluation conditions described above, satisfactory performance was achieved.

It was observed that there was some outgassing from the ULTEM® 1000. This outgassing should be reduced to provide optimum performance of the insulating sealing structure.

ARLON® 1000 and VESPEL® SP-1 are presently under investigation for performance characteristics. Should these materials provide improved outgassing performance, preparation of a main insulator from sheet stock of these materials will require a different means of joint bonding, since these materials are not known to bond well using solvent bonding. There are a number of adhesives recommended by the manufacturer of each material and these adhesives are under present evaluation. The preferred adhesive appears to be an epoxy-resin-based, glass-filled adhesive available from American Cyanamid Co. under the trademark of CYBOND 4537B or CYBOND 4537BHT (a higher $T_g$ cured product).

Other, more complex types of joints may provide better vacuum seals, but to date the lap joint has performed as well or better than other joint designs evaluated.

It would be preferable to form the insulating sealing structure as a single, continuous piece having no joints. This can be done by drying the polymeric material in pellet or powdered form to remove potential outgassing contaminants, followed by melt compression or injection molding into the desired insulating sealing structure.

Figure 5:
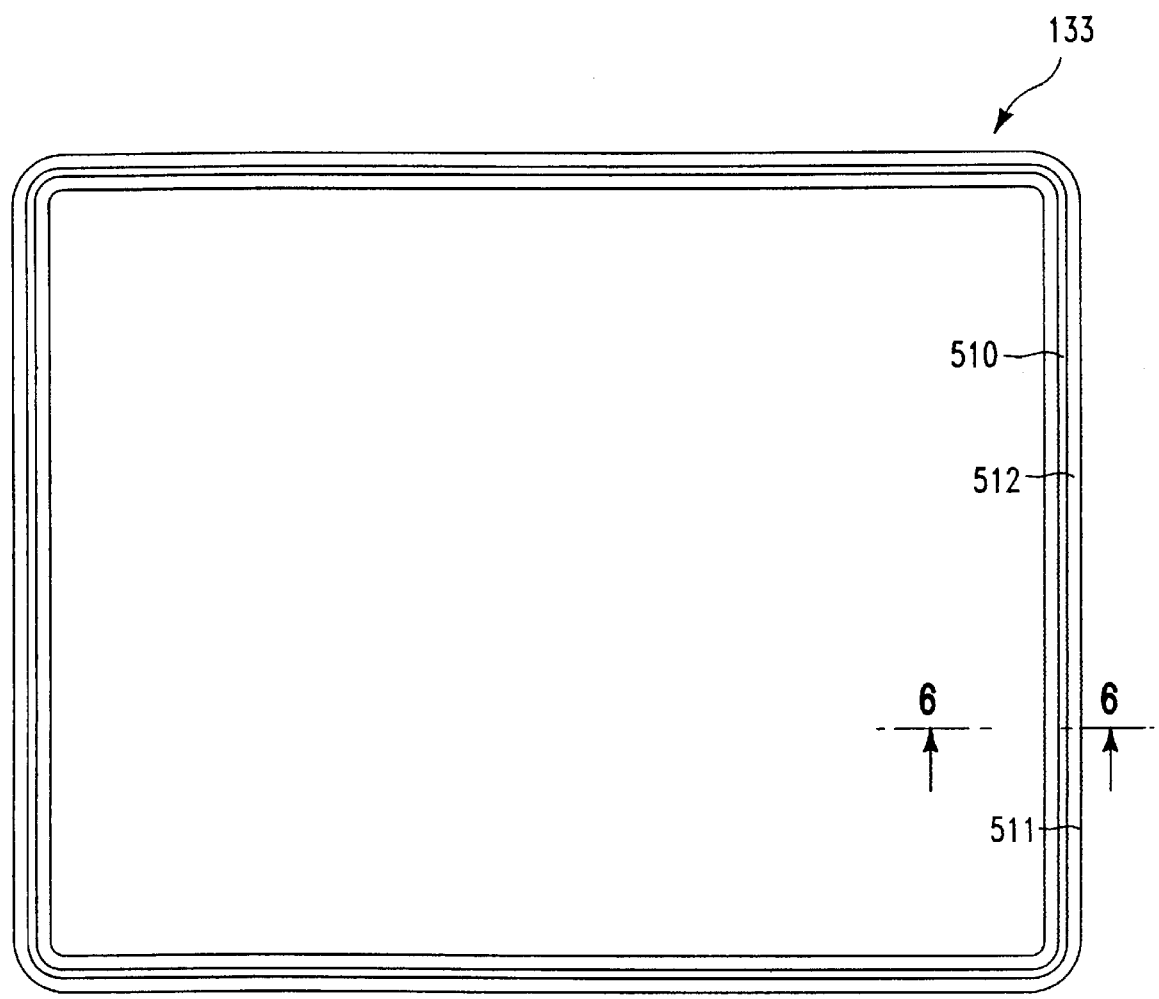
FIG. 5 shows a main insulator for use in a sputtering process chamber of the kind shown in FIG. 1. This main insulator has an O-ring groove machined into its sealing surface.
Figures 6A, 6B, 6C:
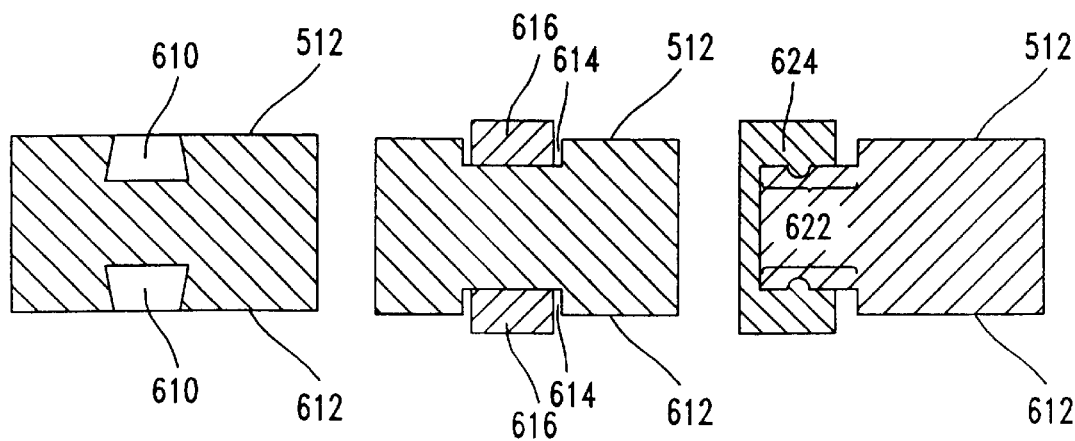
FIG. 6A shows a cross sectional view of an O-ring groove of the kind depicted in FIG. 5, which is machined into the sealing surface of a main insulator of the present invention.
FIG. 6B shows a cross sectional view of a second O-ring groove of the kind depicted in FIG. 5, with an O-ring, preferably elastomeric, in place.
FIG. 6C shows a cross sectional view of an alternative groove structure which could be machined along the edge of a main insulator and fitted with a capping structure, preferably elastomeric, which provides a sealing surface for the main insulator.

One preferred embodiment of the insulating sealing structure comprises a groove machined on at least one surface of the structure which enables the structure to be used in combination with an elastomeric O-ring, to achieve an adequate seal at minimal contact pressures between the insulating sealing structure and any other surface with which a seal is to be formed. FIG. 5 illustrates main insulator 133 having an upper sealing surface 512 with O-ring groove 510 machined therein. FIG. 6A shows a cross sectional view of an O-ring groove 610 of the kind depicted in FIG. 5, which groove 610 is machined into upper sealing surface 512 and lower sealing surface 612 of main insulator 133. FIG. 6B shows a cross sectional view of an alternative O-ring groove 614 of the kind depicted in FIG. 5, which O-ring groove 614 is machined into upper sealing surface 512 and lover sealing surface 612 of main insulator 133. An elastomeric O-ring 616 of a high temperature material such as Viton®, for example, is shown in position in O-ring groove 614. FIG. 6C shows a cross sectional view of an alternative groove structure 622 which could be machined along the exterior edge 511 of a main insulator 133. Alternative groove structure 622 is fitted with a capping structure 624 preferably comprised of a high temperature elastomeric material able to function at 300° F. (148.9° C.) or higher, which provides a sealing surface for main insulator 133.

A second preferred embodiment of the insulating sealing structure comprises a continuous contacting bead or molding which has been machined upon or formed on at least one surface of the structure. FIG. 7A shows a cross sectional view of a sealing bead or molding 710 machined upon upper sealing surface 711 and lower sealing surface 713 of main insulator 133. FIG. 7B shows a cross sectional view of an alternative form of sealing bead 712 machined upon upper sealing surface 711 and lower sealing surface 713 of main insulator 133. The continuous contacting bead or molding eliminates the need for an O-ring to provide a seal with a mating surface.

A third preferred embodiment of the insulating sealing structure comprises the insulating sealing structure having on at least one of its surfaces a continuous coating of an elastomeric material which assists the insulating sealing structure in making an adequate seal with a mating surface. FIG. 7C shows a cross sectional view of a layer 714 of sealing material, preferably a high temperature elastomeric material such as Viton®, for example deposited upon upper sealing surface 711 and lower sealing surface 713 of main insulator 133. FIG. 7D shows a cross sectional view of a bead of sealing material 716, preferably a high temperature elastomeric material, deposited upon upper sealing surface 711 and lower sealing surface 713 of main insulator 133.

Figure 8A:
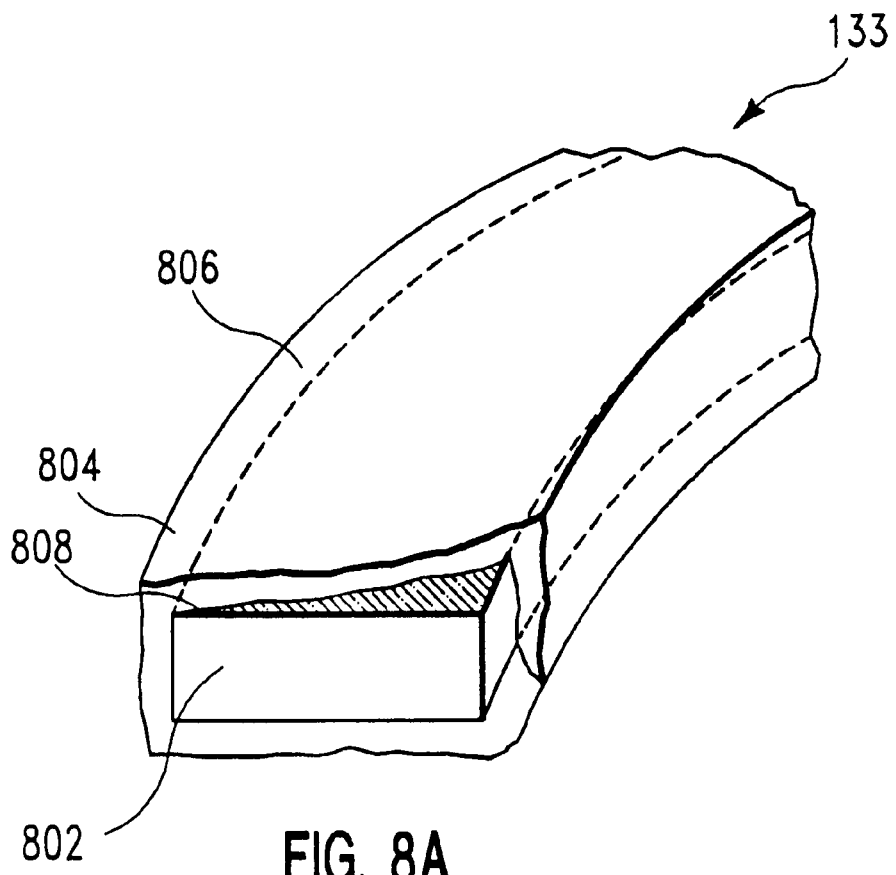
FIG. 8A shows a cutaway perspective view of an embodiment of the main insulator of the present invention having a rigid composite center member with an exterior surface sealing layer or coating.

In a fourth preferred embodiment, Shown in FIG. 8A, the main insulator sealing structure 133 has a rigid central portion or member 802 with an electrically insulating exterior surface layer 804 applied over rigid central portion 802. The surface 806 of insulator sealing structure 133 is polished to a desired roughness height of less than about 0.40 $\mu$m, to enable sealing against a mating surface, where the seal must withstand a vacuum of at least $10^{-6}$ Torr. Preferably, the surface 806 is polished to a roughness height of less than about 0.20 $\mu$m to enable a seal against a vacuum of between about $10^{-8}$ and $10^{-9}$ Torr. Surface roughness is a critical factor necessary to enable sealing under extreme vacuum conditions. Not all materials are capable of being cast or polished to meet this requirement while having the desired dielectric properties and operational temperature range needed to function in the intended application as previously described.

The rigid central portion 802 is fabricated from materials such as metal; graphite, glass or polymeric fiber reinforced polymeric materials; and, polymeric materials having particular structural characteristics. In one preferred embodiment, the metal is aluminum. In another preferred embodiment, the rigid central portion 802 is a graphite fiber or glass fiber reinforced polymeric material. In each case, the material of construction of rigid central portion 802 must not outgas in a manner which is detrimental to performance of the insulating sealing structure and must be thermally and dimensionally stable under operational conditions previously described for the insulating sealing structure 133. The rigid central portion 802 inhibits deformation of the structure 133. Inhibition of deformation is important both in terms of handling of the structure and to ensure that the sealing capability of the structure is not impaired under extreme vacuum conditions and pressure applied by mating surfaces.

Electrically insulating exterior surface layer 804 provides at least a portion of the required dielectric capability necessary to prevent voltage breakdown under the operating conditions (typically in the range of about 1,500 V to about 3,000 V). The required dielectric strength of surface layer 804 is at least 1.96 MV/m in air. Exterior surface layer 804 is comprised of an insulating material selected from the group consisting of phenolic, polyetherimide, polyimide, polyketone, polyetherketone, polyetheretherketone, epoxy, aluminum oxide, silicon oxide, aluminum nitride, silicon nitride, and combinations thereof. The overall thickness of surface layer 804 varies according to the electrical resistivity and dielectric strength of the insulative material used to form the insulator. Preferably the insulative material has a volume resistivity of at least $10^{12}$ $\Omega$-cm, and more preferably a volume resistivity of at least $10^{14}$ $\Omega$-cm, and a dielectric constant of at least about 2. When the insulative material has a dielectric constant of about 3.5, surface layer 804 typically ranges from about 10 $\mu$m to about 500 $\mu$m in thickness, and more typically from about 100 $\mu$m to about 300 $\mu$m in thickness.

When a polyimide is used as the surface layer 804, the polyimide has a dielectric breakdown strength of at least about 100 V/mil (3.9 V/$\mu$m). Polyimides which are known to perform in the application include Vespel® SP-1, previously described herein, and UPILEX®, particularly UPILEX® S, manufactured by Ube Industries Ltd., Japan. Optionally, an uncured or partially cured polyimide 808 may be used as an adhesive to bond a surface layer 804 which is a precured or partially precured polyimide film to rigid central portion 802.

Epoxy and phenolic materials are also exhibit an acceptable dielectric breakdown strength, are capable of performing at temperatures in excess of about 200° C. and can be cast or cast and polished to provide a surface finish having the smoothness necessary to provide the required seal. For example, fiberglass-reinforced epoxies of the kind used to produce G-3 fiberglass-reinforced epoxy or fiberglass-reinforced phenolics of the kind used to produce G-10 and G-11 fiberglass-reinforced phenolic are capable of performing at operational temperatures to which they would be exposed in physical vapor deposition processes and can be polished to provide the surface finish required.

A polymeric surface layer 804 may be applied using injection molding, extrusion, pultrusion, and casting/curing techniques. Polymeric surface layer 804 may be a precured film which is applied using an adhesive which is cured in a manner so that the cured adhesive will not outgas under the process—operational conditions at which insulating sealing structure 133 must perform.

When the insulating surface layer 804 is comprised of an inorganic material such as aluminum nitride, silicon nitride, or silicon oxide, a preferred method of application of surface layer 804 over rigid central portion 802 is by physical vapor deposition, preferably by sputtering. Sputtering of aluminum nitride, silicon nitride, or silicon oxide can be accomplished using standard sputtering techniques and a target comprised of the desired compound. The target may also be aluminum or silicon, with the compound being formed by the addition of nitrogen or oxygen as a reactive gas during the sputtering process. Reactive sputtering techniques are well known in the art.

When insulating surface layer 804 is comprised of one of the inorganic materials listed above, a preferred material for rigid central portion 802 is aluminum, and more preferably aluminum having a layer of aluminum oxide on its surface.

Figure 8B:
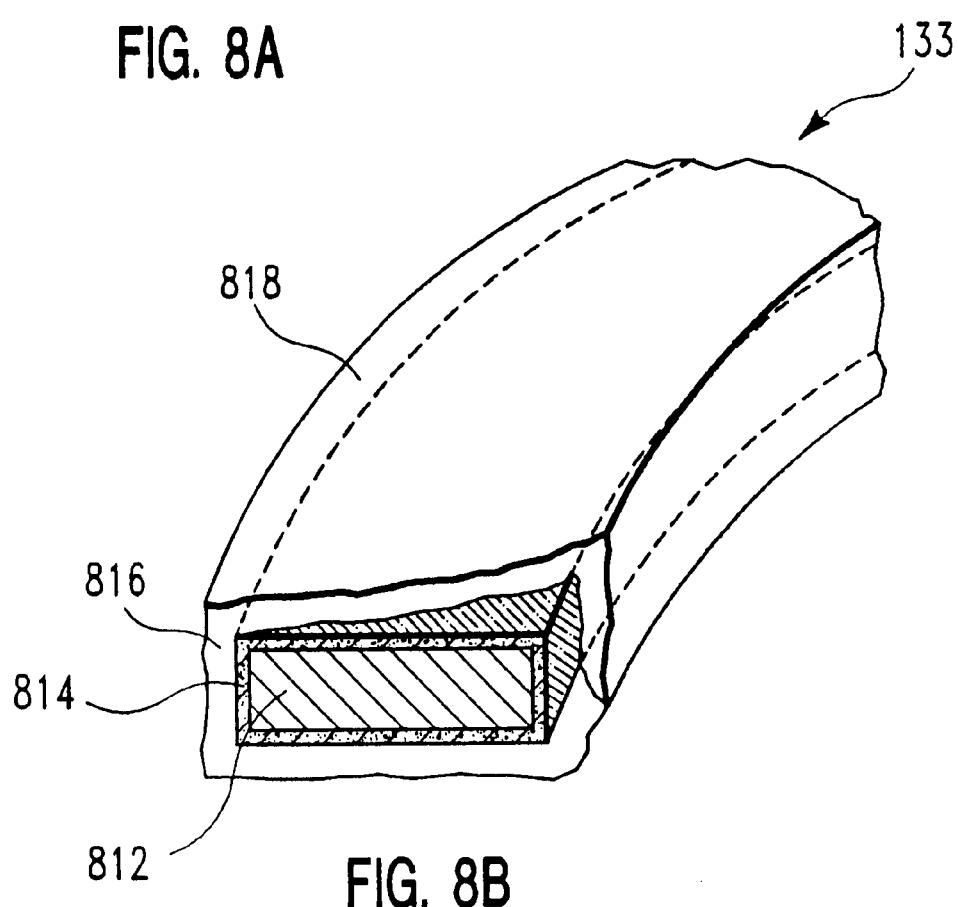
FIG. 8B shows a cutaway perspective view of an embodiment of the main insulator of the present invention having a rigid center member which has been treated to create an overlying first layer which provides particular insulating and bonding characteristics, followed by application of a second layer which provides the desired sealing surface.

FIG. 8B shows a preferred embodiment in which the main insulator sealing structure 133 has a rigid central portion 812 comprised of aluminum. The surface of the aluminum has been anodized to produce aluminum oxide layer 814, and finally, a finishing insulating layer of silicon nitride 816 has been applied over the surface of aluminum oxide layer 814.

Aluminum oxide layer 814 serves three purposes: It provides a portion of the required dielectric strength; it provides a continuous coating underlying finishing insulating layer 816, to compensate for any pinholes in finishing insulating layer 816; and, it provides a good bonding surface for attachment of finishing insulating layer 816.

The surface 818 of the silicon nitride layer 816 has been lapp polished to a surface finish having a roughness height of less than about 0.40 $\mu$m in the direction perpendicular to the seal to enable sealing against a mating surface against a vacuum of at least $10^{-6}$ Torr. Preferably, the surface 818 is polished to a roughness height of less than about 0.20 $\mu$m to enable a seal against a vacuum of between about $10^{-8}$ and $10^{-9}$ Torr. Although the finishing insulating layer for this particular embodiment is silicon nitride, aluminum nitride and silicon oxide would be expected to perform as well.

Finishing insulating layer 816, in combination with aluminum oxide layer 814 provides the required dielectric capability necessary to prevent voltage breakdown under the operating conditions previously specified. Silicon nitride exhibits a volume resistivity of about $10^{15}$ $\Omega$-cm, and has a dielectric strength of about 3.6 to 9.6 V/mil, depending on thickness and method of fabrication. The thickness required for the silicon nitride finishing insulating layer 816 is at least about 20–25 Å, presuming no electrical insulation contribution from the aluminum oxide layer.

The preferred embodiments of the present invention, as described above and shown in the Figures are not intended to limit the scope of the invention, as demonstrated by the claims which follow, since one skilled in the art can, with minimal experimentation, extend the scope of the embodiments to match that of the claims.

We claim:

1. A physical vapor deposition apparatus including an insulating sealing structure capable of sealing against a vacuum of at least $10^{-6}$ Torr, comprising:

a target assembly which functions as a cathode;

a process chamber which functions as an anode; and, an insulating sealing structure disposed between said target and said process chamber, said insulating sealing structure comprising a) a rigid central portion or member for inhibiting deformation; and, b) an electrical insulator applied to said central portion, wherein said electrical insulator has a dielectric strength of at least 1.96 MV/m in air and a surface finish roughness height of less than about 0.40 $\mu$m, and wherein said electrical insulator encompasses said rigid central portion.

2. The physical vapor deposition apparatus of claim 1, wherein said rigid central portion or member comprises a material selected from the group consisting of a metal, a fiber reinforced polymeric material, and a polymeric material, wherein said material outgassing under said insulating sealing structure operational conditions does not result in a reduction in the vacuum applied across a sealing surface of said insulating sealing structure.

3. The physical vapor deposition apparatus of claim 2, wherein said rigid central portion or member comprises a metal.

4. The physical vapor deposition apparatus of claim 3, wherein said metal is aluminum.

5. The physical vapor deposition apparatus of claim 4, wherein said aluminum has been treated to produce an aluminum oxide surface layer.

6. The physical vapor deposition apparatus of claim 2, wherein said rigid central portion or member is a fiber reinforced polymeric material and said fiber comprises a graphite, silicon nitride, silica, or a glass.

7. The physical vapor deposition apparatus of claim 2, wherein said rigid central portion or member is a polymeric material selected from the group consisting of phenolic, polyetherimide, polyimide, and polyetheretherketone.

8. The physical vapor deposition apparatus of claim 2, wherein said electrical insulator is selected from the group consisting of polyetherimide, polyimide, polyketone, polyetherketone, polyetheretherketone, epoxy, aluminum oxide, silicon oxide, aluminum nitride, silicon nitride, and combinations thereof.

9. The physical vapor deposition apparatus of claim 2, wherein said rigid central portion material comprises aluminum which has been treated to create a surface layer of aluminum oxide, and wherein said electrical insulator comprises a polyimide.

10. The physical vapor deposition apparatus of claim 2, wherein said rigid central portion material comprises aluminum which has been treated to create a surface layer of aluminum oxide, and wherein said electrical insulator is selected from the group consisting of silicon oxide, aluminum nitride, and silicon nitride, or a combination thereof.

* * * * *